(12) United States Patent
Savoia

(10) Patent No.: US 7,485,887 B2
(45) Date of Patent: Feb. 3, 2009

(54) PASSIVE ALIGNMENT OF PHOTODIODE ACTIVE AREA IN THREE AXES USING MICROSCOPIC FOCUS

(75) Inventor: David J. Savoia, Nashua, NH (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 101 days.

(21) Appl. No.: 11/811,530

(22) Filed: Jun. 11, 2007

(65) Prior Publication Data

US 2008/0305562 A1    Dec. 11, 2008

(51) Int. Cl.
*G01N 21/86* (2006.01)

(52) U.S. Cl. .................. 250/559.3; 250/221

(58) Field of Classification Search ............. 250/559.3, 250/559.29, 221, 239, 216, 201.1, 201.3, 250/201.2; 257/432–435, 797; 356/399, 356/400
See application file for complete search history.

(56) References Cited

U.S. PATENT DOCUMENTS 5,998,878 A * 12/1999 Johnson ..................... 257/797

* cited by examiner

*Primary Examiner*—Que T Le
(74) *Attorney, Agent, or Firm*—Robert K. Tendler; Daniel J. Long

(57) ABSTRACT

A fixturing system and microscope/video camera setup enables an operator to manipulate a photodiode into position optically using known good targets for the X and Y location and using microscope focus/defocus/refocus for locating the active area of the avalanche photodiode exactly at the focal point of the lens.

19 Claims, 12 Drawing Sheets

PASSIVE ALIGNMENT OF PHOTODIODE ACTIVE AREA IN THREE AXES USING MICROSCOPIC FOCUS

STATEMENT OF GOVERNMENT INTEREST

The invention was made with United States Government support under Contract No. DAAH01-03-C-0010. The United States Government has certain rights in this invention.

FIELD OF THE INVENTION

This invention relates to optics and more particularly to the alignment of a photo diode active area with respect to a lens in three axes utilizing microscope focus.

BACKGROUND OF THE INVENTION

A photodiode is typically mounted and sealed into a windowed housing, such as a TO-8 metal can or other such containers. When mounting the canned photodiode on to a printed wiring board (PWB) or other carrier, it is generally difficult to locate the diode's active area in specific X, Y, and Z axes within a certain tolerance range. In addition, once the photodiode is hermetically sealed inside the can so that the active area is underneath the glass window inside, it is inaccessible to contact or probing of any kind. Thus, direct manipulation of the photodiode sealed within a mounted can to locate the diode's active area in the specific X, Y and Z axes is precluded. Such direct manipulation might damage the photodiode, anyway.

As such, locating the diode's active area in the specific X, Y, and Z axes within a certain tolerance range must be performed during the mounting process. Currently, a photodiode is typically soldered directly to a printed wiring board with no control of the X, Y and Z locations of its active area. For many applications, this non-controlled mounting process produces sufficient optical alignment for the photodiode to carry out its intended function, such as detection of infrared light (IR). However, some photodiode applications require a more stringent tolerance range on the X, Y, and Z location of the active area of the photodiode. Conventional fabrication processes are simply not sufficiently controlled to meet these tighter tolerance ranges required for functionality of the end product.

What is needed, therefore, are techniques for locating the active area of a photodiode in the X, Y, and Z optical axes within a certain tolerance range.

More particularly, in infrared missile guidance systems it is often necessary to be able to collect as much light as possible from reflections from targets illuminated by laser target designators. In order to detect the returns from the laser target designator, typically an array of photodetectors is arranged to detect the reflections, with each of the photodetectors provided with an imaging or relay lens adjacent the photodetector so that the reflected light is focused onto the active area of the photodiode.

The basic problem is to locate an avalanche photodiode on a printed circuit board exactly at the focus of the lens that focuses the light onto the avalanche photodiode. This distance needs to be controlled so that the maximum amount of light falls on the diode. If the diode is too far away, the cone that is formed by the lens spreads. If the photodiode is too close to the lens, the light is too scattered.

In the past, avalanche photodiodes being within the hermetically sealed can have been positioned when the diode is turned on and the position of the can moved until a maximum in the output of the diode is reached. This constitutes an active tuning system.

The problem, however, is how to tune or locate the avalanche photodiode by passive techniques. Thus, prior to manufacture it is important to be able to accurately position the photodiode at the focus of its associated lens prior to activating the photodiode. Because the photodiode surface is underneath a piece of glass and in a sealed can, one cannot access it physically. Thus, its position up and down and side to side inside the can varies. Since one cannot physically touch the photodiode surface, there are no mechanical means by which the photodiode surface can be placed exactly at the focus of the associated lens.

As a result, the tolerance by which the photodiode active surface is located relative to the fixed outer dimensions of the can do not provide the required accuracy for photodiode active area placement especially in laser target designation applications.

In one typical missile guidance or seeker applications for infrared return detection, the tolerance for the surface of the active area of the photodiode being at the focus of the lens is on the order of plus or minus 0.003 inches.

In short, a manufacturing technique is required to be able to locate the avalanche photodiode can in an associated carrier such that by manipulation of the can one can place the active photodiode surface at a precise distance from a lens corresponding to the focal point of the lens.

SUMMARY OF INVENTION

In order to position the photodetective active surface at the focal point of a lens, in one embodiment the can carrying the avalanche photodiode is located in a carrier having an oversized aperture such that the can is movable within this aperture. A fixturing tool is utilized to move the can within the oversized aperture, both laterally in the X and Y directions and also vertically in the Z direction by temporarily affixing the bottom of the can to a magnetic plunger or vacuum-operated fixturing tool. This tool is moved in orthogonal directions through the use of micrometers, with the can, diode and carrier viewed by a microscope and displayed on a screen. The image of the active area of the diode is viewed by the microscope. Thus, when the magnetic plunger is moved in the X and Y directions, the image of the active area of the photodiode moves, with alignment achieved when the images lines up with the circle, and the can is moved in the X and Y directions until circular. The outline of the active area lines up with a circular target superimposed on the screen.

In order to position the active area of the avalanche photodiode at the focal point of the lens, the microscope is set up so that at the focal point, the active area of the avalanche photodiode is in focus. When the active area is viewed by the microscope, the magnetic plunger is moved in and out until such time as the image of the active area of the photodiode comes into focus. It is at this point that the active area of the avalanche photodiode is exactly at the focal point of the lens within tolerances that are much tighter than those associated with indexing the can or housing of the avalanche photodiode.

When the active area of the avalanche photodiode is properly positioned at the focal point of the lens, then the can is adhered or fixed to the oversized aperture so that when the lens is press fit to the avalanche photodiode carrier, the exceedingly tight tolerances of the location of the active area of the avalanche photodiode are maintained.

In summary, the fixturing system and microscope/video camera setup enables an operator to manipulate the photodiode into position optically using known good targets for the X and Y location and using microscope focus/defocus/refocus for locating the active area of the avalanche photodiode exactly at the focal point of the lens.

The subject technique can be used to mount multiple cans to a carrier plate or to mount a single such component to the carrier plate.

In one embodiment, the can carrying the avalanche photodiode is temporarily attached to a plunger and is initially centered in the oversized aperture in the carrier plate. The plunger is movable in three orthogonal directions by micrometers or the like and a microscope having a video camera is positioned over the carrier plate and the can, with the microscope video output coupled to a suitable display. The microscope is first utilized to bring a datum plane or surface on the carrier into focus, with the microscope having an associated digital depth readout zeroed on this datum plane.

A relay lens is adapted to be located at a fixed distance from the datum plane above the carrier and the exact position of the focal point of the lens relative to the datum plane is established. In one embodiment the focal point is offset 0.018 inches above the datum plane.

Having zeroed the digital depth meter on the datum plane so that it reads 0.000, one readjusts the microscope utilizing the digital depth readout to be at this offset distance, in this case 0.018 inches. The plunger on which the can is mounted is moved along the Z axis until such time as the image of the active area of the avalanche photodiode comes into focus. When this occurs, the active area of the avalanche photodiode is precisely 0.018 inches from the datum plane, which is precisely the right distance from the overlaying relay lens, i.e., at its focal point.

Prior to adjusting the Z direction, the X and Y location of the active surface of the photodiode is ascertained through the use of a target generator that projects a circle on the display to which the microscope is coupled. The plunger is adjusted in the X and Y directions until the active area of the photodiode, usually a circle, coincides with the target-generated circle. At this point accurate lateral position of the actual area of the avalanche photodiode is achieved, leaving the adjustment of the vertical direction utilizing the aforementioned microscope focus technique.

When the appropriate positioning of the active surface of the avalanche photodiode is attained, the exterior of the can is adhesively attached to the oversized aperture such that by precisely locating the relay lens vis-à-vis the carrier, the tolerance of the position of the active surface of the photodiode with respect to the focal point of the lens is assured.

When utilizing a carrier with multiple photodiode cans and a like number of relay lenses on top of the carrier aligned with the underlying cans and the associated active photodiode elements, then by properly positioning the photodiode cans within the oversized apertures using the in-focus and target location technique described above, the output of the array is maximized, then to be able to collect the maximum amount of light impinging on the relay lenses.

The subject system, while primarily used in infrared seeker assemblies to detect reflections from laser target designators, has application to all optical communications systems using photodetectors to maximize the signal-to-noise ratio, thus to make most efficient use of the particular photodetector.

In summary, the present invention provides a mechanism and process for locating the active area of a photodiode in the X, Y, and Z optical axes within a specific tolerance range. This alignment process is carried out using a fixturing system configured with a microscope/video camera setup, and without making physical contact with the active areas. The fixturing system and a microscope/video camera setup enables an operator to manipulate the photodiode into position optically, using known good targets for X and Y location, and using microscope focus/de-focus/re-focus for the target Z location. Once the photodiode is located in the desired position, it can be fastened in place (e.g., using an ultraviolet-curing adhesive). The techniques can be used to mount multiple canned devices to a carrier plate (e.g., PWB), or to mount a single such component to the carrier plate.

BRIEF DESCRIPTION OF THE DRAWINGS

These and other features of the subject invention will be better understood in connection with the Detailed Description, in conjunction with the Drawings, of which.

DETAILED DESCRIPTION

It will be appreciated that the present invention provides a mechanism and process for locating the active area of a photodiode in the X, Y, and Z optical axes within a specific tolerance range. In one embodiment this tolerance range is between 0.002 and 0.003 inches. This alignment process is carried out using the subject fixturing system configured with a microscope/video camera setup, without making physical contact with the active areas of the photodiodes.

The fixturing system and the microscope/video camera setup enables an operator to manipulate the photodiode into position optically, using known good targets for X and Y location and using the microscope focus/de-focus/re-focus for locating the active area for the target Z location without physically touching the active area. Once the photodiode is located in the desired position in can be fastened in place using, for instance, ultraviolet-curing adhesive.

It is noted that the subject system is a passive alignment system such that the photodiodes are positioned or tuned using passive techniques. Thus there is no requirement in the tuning process to power the photodiode in order to measure their outputs to ascertain maximum output and thus proper alignment.

Figure 1:
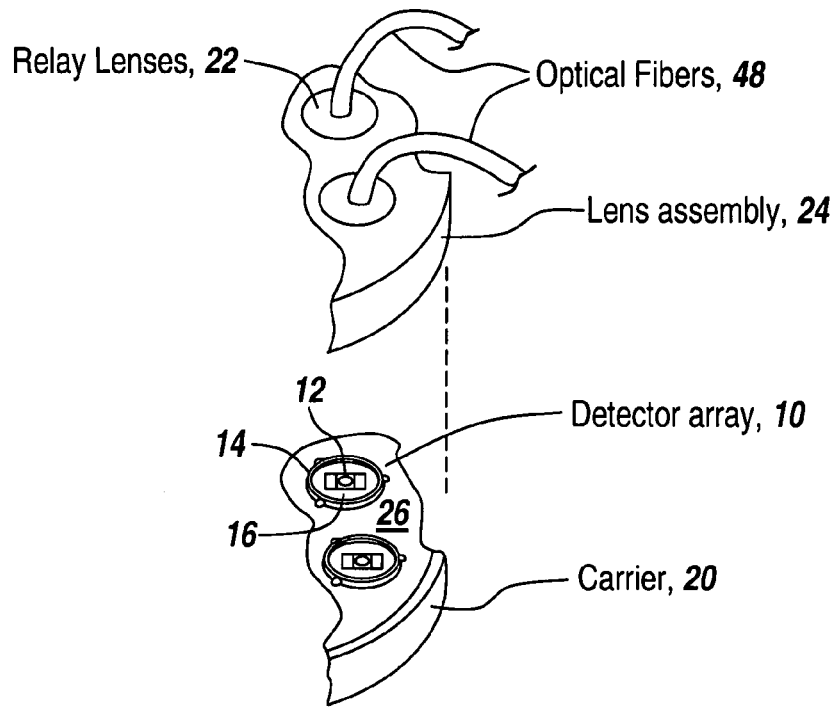
FIG. 1 is a diagrammatic illustration of the use of an array of photo avalanche detectors bounded to a carrier on top of which is placed a lens assembly having individual lenses in alignment with the underlying photodetectors, with light being imaged by relay lenses within the lens assembly from optical fibers.

Referring now to FIG. 1, a photodiode detector array 10 having individual avalanche photodiode detectors 12 located within a can 14 and hermetically sealed thereto by a transparent cover 16 are shown located in a carrier 20 optically aligned with relay lenses 22 in a lens assembly 24 adapted to be positioned over and located on a reference surface 26 of carrier 20. While light can be focused on the lens assembly 24 in any number of ways, in one embodiment optical fibers 28 are utilized to channel light to the detector array.

It is the purpose of the subject invention to provide a method and apparatus for positioning the active areas of detectors 12 so that they lie exactly at the focal point of the relay lenses and to do so passively and without physically touching the active areas of the photodetectors, since access to these active areas from a probing point of view is not possible.

Figure 2:
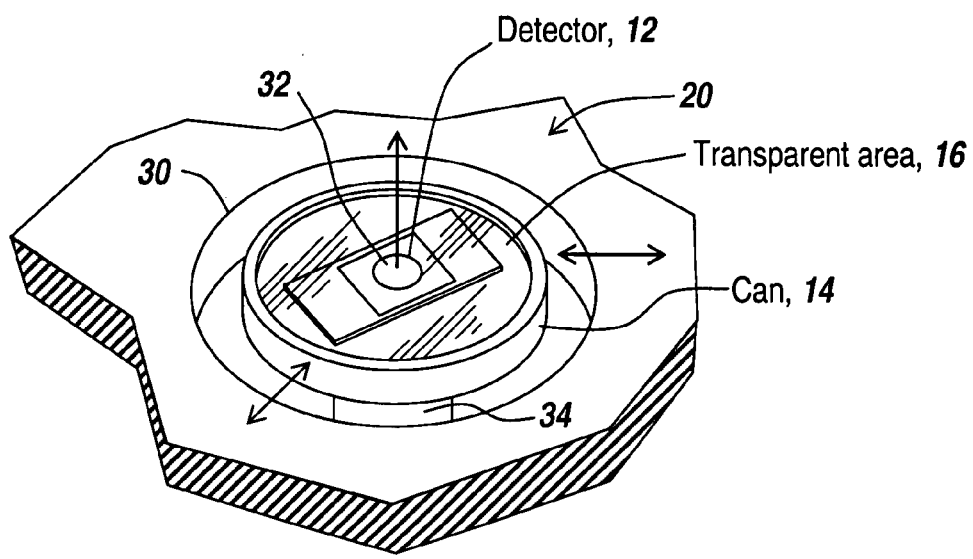
FIG. 2 is a diagrammatic illustration of the placement of one of the detectors in the detector array of FIG. 1 in which the detector is encapsulated in a can having a transparent cover, with the can being positioned in an oversized aperture in the carrier plate such that the can with its associated detector can be moved in orthogonal directions within the oversized aperture.

Referring to FIG. 2, carrier 20 is provided with an oversized aperture 30 into which can 14 is positioned. By oversized is meant that the diameter of aperture 30 is greater than the outside diameter of the can. This permits moving of the can within the oversized aperture.

In the fixturing system to be described, the purpose is to be able to manipulate the position of can 14 in the X, Y, and Z directions within oversized aperture 30 so as to be able to position the active area 32 of detector 12 such that its top surface is exactly at the focal point of the overlying relay lens to an accuracy of between 0.002 to 0.003 inches.

Figure 3:
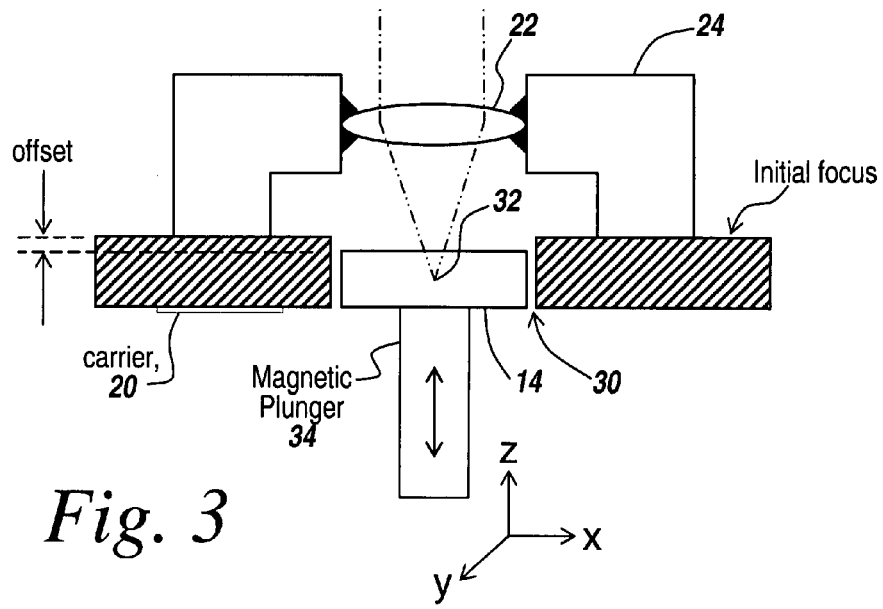
FIG. 3 is a diagrammatic illustration of the placement of a lens in the lens assembly on top of the carrier, with the detector being mounted on a magnetic plunger that can move the can in three orthogonal directions within the aperture such that the active area of the photodetector within the can be positioned exactly at the focal point of the relay lens thereabove.

As will be discussed and referring now to FIG. 3, can 14 having a photodetector active area 30 at the exact focal point of lens 22 is accomplished by manipulating can 14 in oversized aperture 30 in carrier 20 so that by manual manipulation of the can, the active area of the photodetector is appropriately positioned.

This is accomplished through a manipulation utilizing a magnetic plunger 34 that manipulates the can and thus the position of the active area of the photodiode.

As will be seen, the vertical position of the active area of the photodiode is critical. It will be seen that lens assembly 24 is positioned on reference surface 26 and that the active area of the photodiode is precisely positioned relative to this reference surface or datum plane.

The positioning of the active area of the detector is accomplished by offsetting the surface of the active area of the photodiode by a predetermined amount from the reference surface such that when the lens assembly is positioned on reference surface 26, the offset imparted positions the top surface of the active area of the photodetector precisely at the focal point of lens 22.

Figure 4:
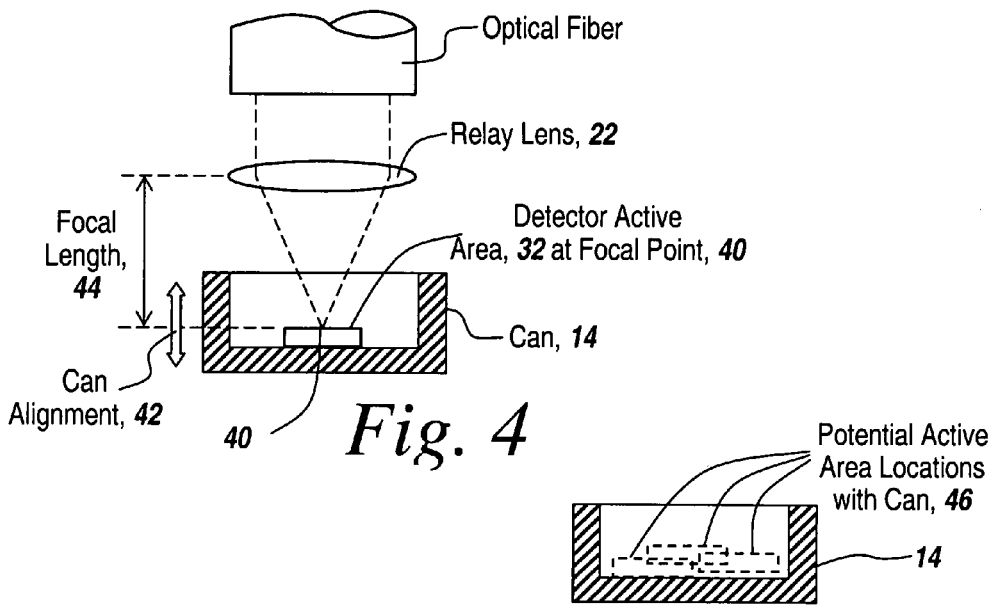
FIG. 4 is a diagrammatic illustration of the positioning of the detector active area at the focal point of a relay lens through the vertical movement of the can such that the active area is precisely at the focal point of the lens.

More particularly and referring now to FIG. 4, if relay lens 22 is positioned as shown, its focal point can be seen by focal point 40. Can 14 is manipulated in the vertical direction as illustrated by double-ended arrow 42 such that in the Z axis dimension the detector active area 32 is at the focal point of the lens which is at a distance equivalent to the focal length of the lens, here illustrated by double-ended arrow 44.

Figure 5:
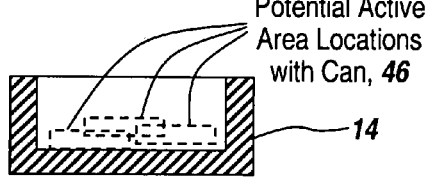
FIG. 5 is a diagrammatic illustration of the potential active area locations within the can of FIG. 4 indicating that by positioning the can itself one cannot achieve proper positioning of the active element of the photodetector.

Referring to FIG. 5, it will be appreciated that the location of the active areas of the photodiodes within can 14 can vary considerably and no attempt during manufacture of the encapsulated detector is made to assure that the location of the active area will be dimensionally registered to the wall of the can. Thus the potential positions for the active area of a photodetector can be as illustrated at 46.

Figure 6:
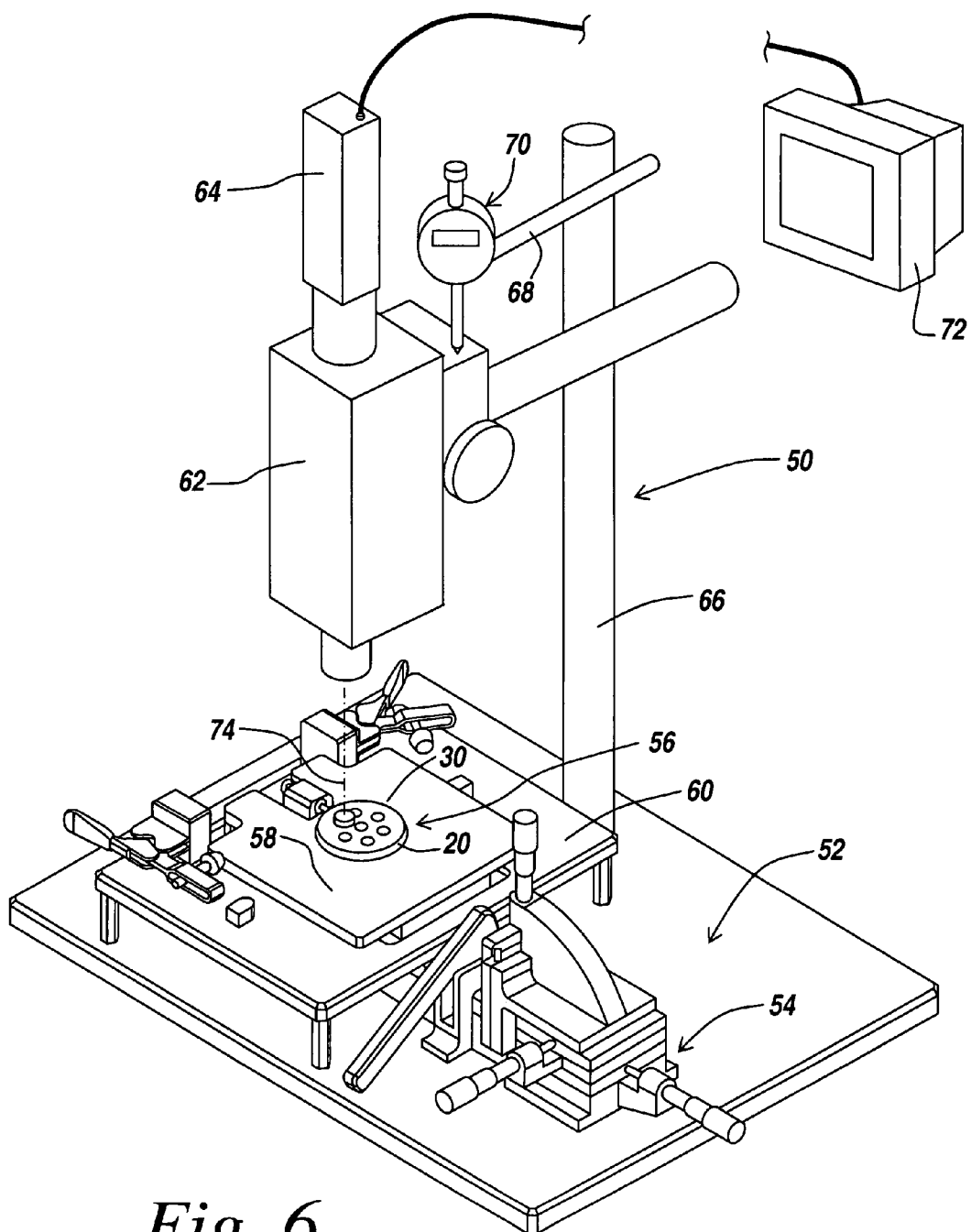
FIG. 6 is a diagrammatic illustration of a fixturing tool utilized in the positioning of the active areas of the detectors at a fixed point below the surface of the carrier through the manipulation of a plunger from underneath the carrier, which projects up through a selected hole in the carrier, which plunger carriers the detector can and maneuvers the detector can within the oversized aperture of the carrier utilizing a microscope and display for the alignment procedure.

The alignment or tuning of the active area of the photodiode relative to the focal point of the relay lens is accomplished using the fixturing tool illustrated in FIG. 6. Here the tool 50 includes a base 52 and an X, Y, Z micrometer 54 that positions the aforementioned plunger within oversized aperture 30 in carrier 20.

The carrier is positioned on a rotary table 56, which is located on a sliding table 58 that in turn is mounted to a fixed table 60. A microscope 62 is coupled to a video camera 64, with the microscope/camera assembly being mounted to base 52 by a vertical support 66 and a horizontal support 68.

A digital depth indicator 70 is coupled to microscope 62 and video camera 64 to monitor the exact position of the optical elements within the microscope relative to carrier 20. Note that a display 72 is coupled to camera 64.

Figure 7:
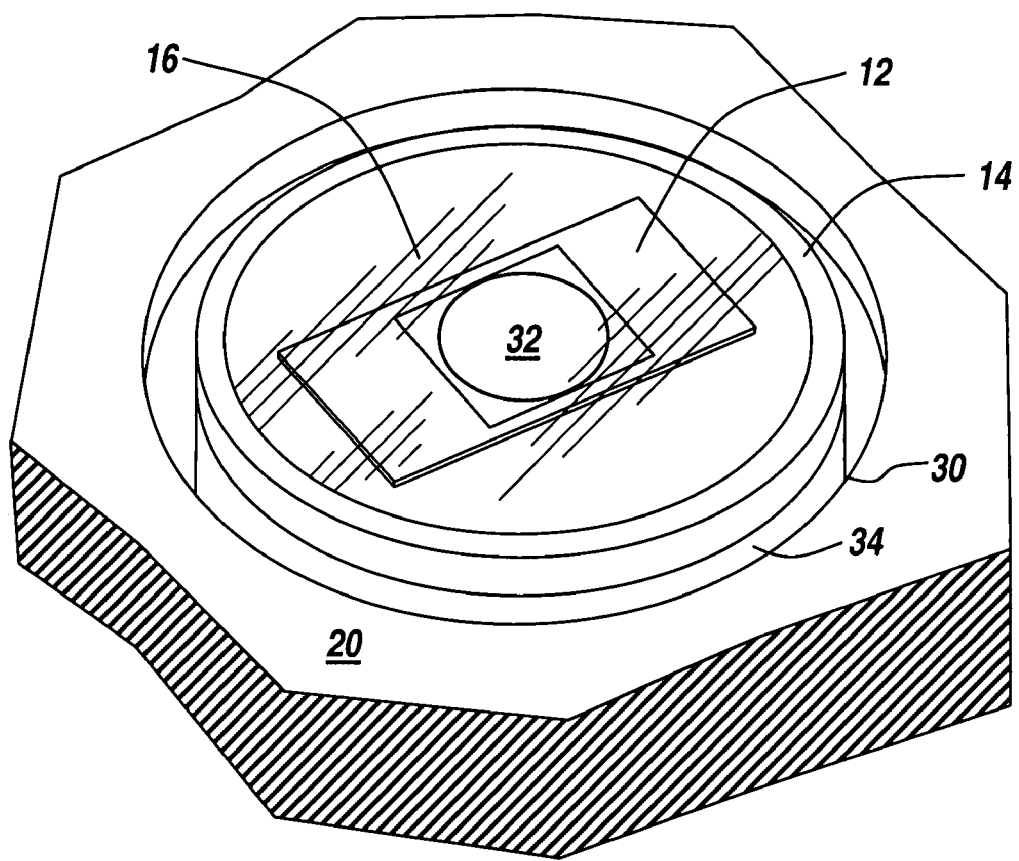
FIG. 7 is a diagrammatic illustration of the photodiode mounted within a can, showing the active area of the photodiode as well as the can being situated in the aforementioned oversized aperture in the carrier.

Referring now to FIG. 7, hermetically sealed metal can 14 carries detector 12 with its associated active area 32 within oversized aperture 30 in carrier 20, with can 14 being releasably attached to plunger 34. It is noted that during the initial setup of the alignment procedure the photodiode can has legs that project down through carrier 30 and through oversized holes in rotatable table 56 such that the oversized holes allow for X, Y, Z manipulation of the photodiode can. The oversized apertures in the rotary carrier can be clocked around such that each of the diodes in associated cans are positioned along the optical axis 74 of microscope 62.

In one example there are seven photodiodes that are being mounted to the carrier plate. Thus, each of the seven photodiodes is placed at a corresponding position numbered 1 through 7.

The carrier plate to which the photodiodes are to be mounted is then placed over the diodes such that each of the photodiodes floats within its corresponding oversized aperture in the carrier plate. As can be seen in connection with FIG. 16 described hereinafter, two clamps are used to secure the carrier plate to the rotary table, with the rotary table serving as a carousel configured with tooling pins to index the apertures in the carrier plate.

Figure 16:
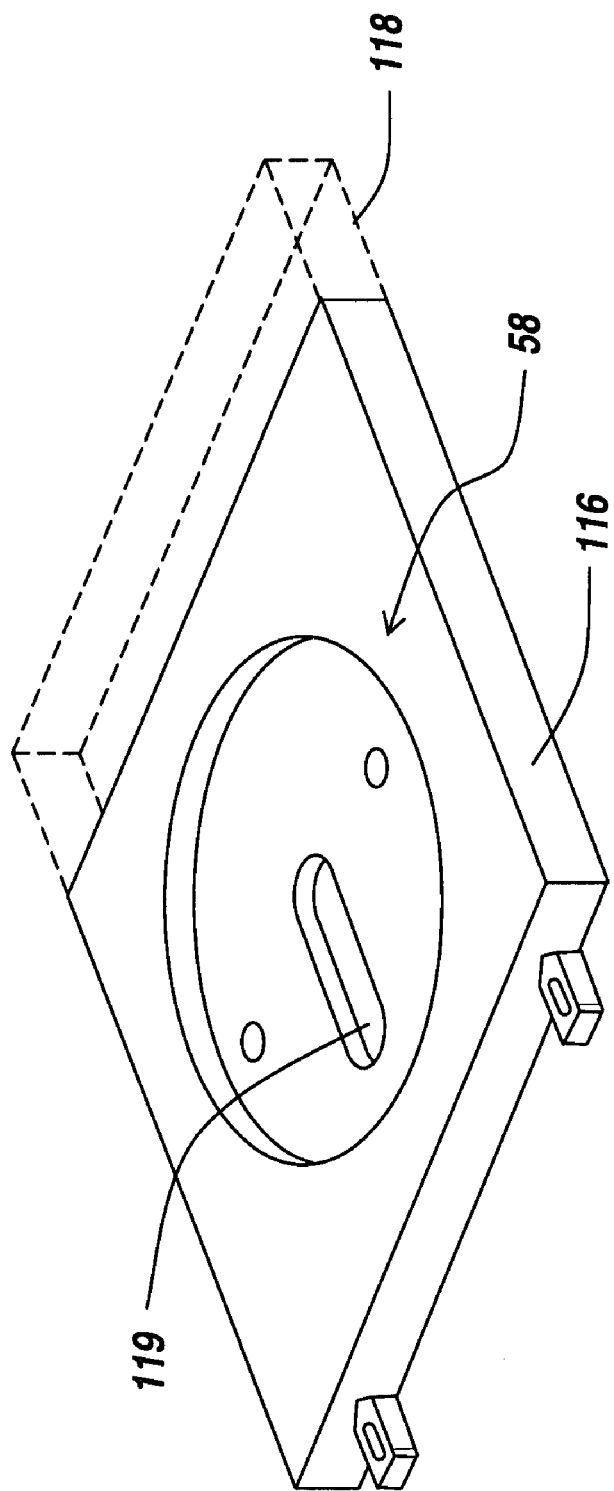

As will also be described, each of the seven photodiodes is processed one at a time, with the sliding table 58 having a position as shown at 118 in FIG. 16 that allows the photodiodes on the perimeter of the rotary table to be processed and a position 118 to allow the photodiode in the center location of the rotary table to be processed. Other than the forward and backward movement, sliding table 58 is fixed with respect to the optical axis of the microscope.

It will be appreciated that the sliding table can be configured with a recessed mounted ball bearing in which the rotating table sits. Note that the sliding table is configured with an elongated slot 119 that allows for the forward and backward movement without having to lower the plunger.

Figure 8:
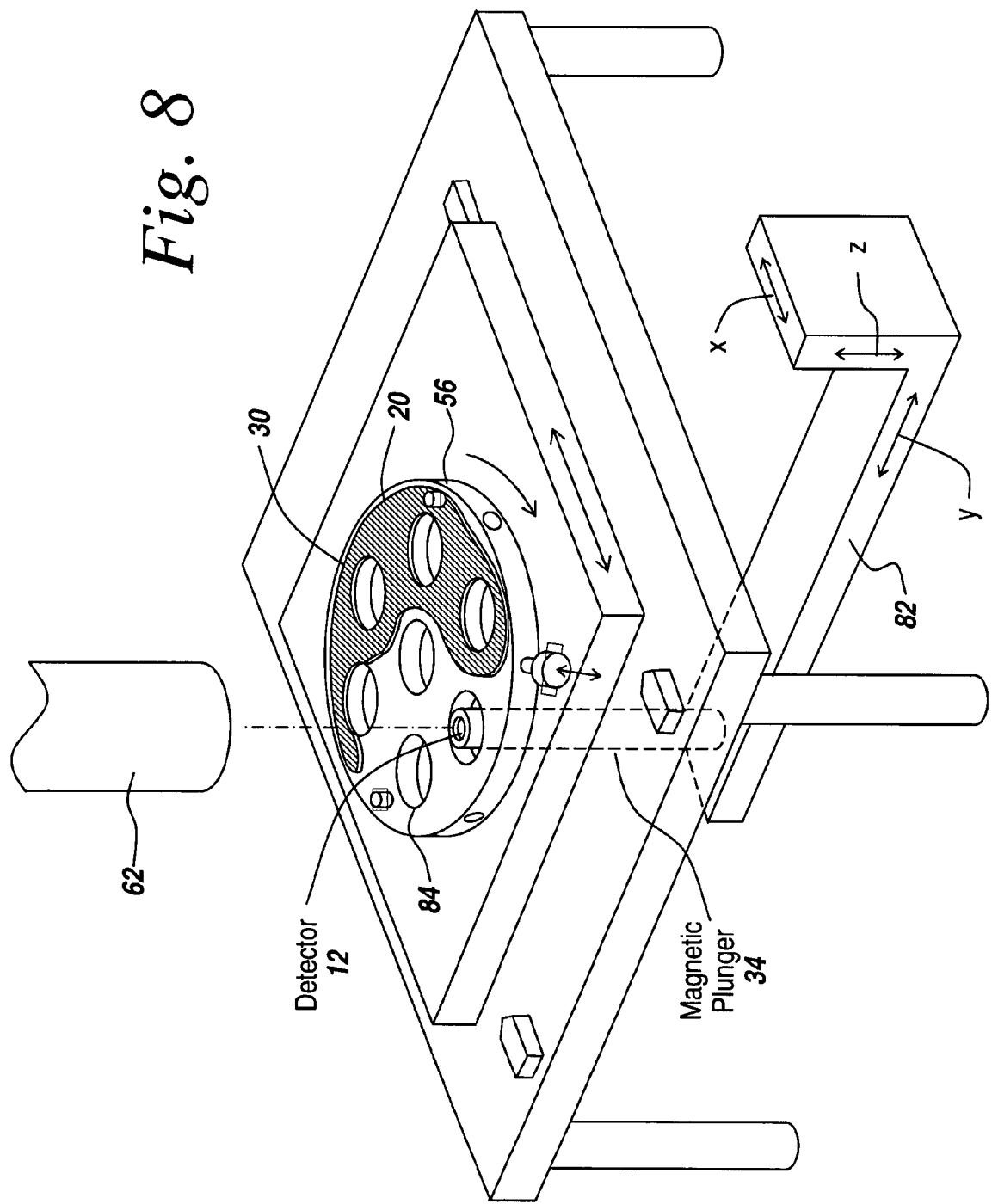
FIG. 8 is a diagrammatic illustration of the utilization of a magnetic plunger or vacuum fixturing tool that positions the detector and associated can within the oversized aperture within a carrier, with the plunger being manipulated in three directions utilizing micrometers.

Referring now to FIG. 8, with carrier 20 secured over in an alignment with apertures of carrier 20, when a detector 12 is releasably secured to magnetic plunger 34, it can be seen that by movement of the magnetic plunger in the oversized apertures both in the rotatable plate and in the corresponding carrier permits accurate positioning of the active area of the photodiode under the inspection of microscope 62. Here it can be seen that a portion of carrier 20 is cut away so as to expose the top portion of rotary table 56.

As can be seen, the position of magnetic plunger 34 is controlled in the X, Y, and Z axes by a micrometer-driven support 82 such that the magnetic plunger and the associated detector can be driven in mutually orthogonal axes within the oversized aperture 30. Here it can be seen that rotary plate 56 has an even further oversized aperture 84 underlying the corresponding aperture 30 in carrier 20. Thus, the micrometer couples to the X, Y, Z arm 82 to provide adjustability for the plunger, which is directly beneath the photodiode being mounted.

In one embodiment the plunger is configured with a magnet recessed into the tip of the plunger such that the magnetic tip allows the plunger to hold onto the photodiode, with the X, Y, and Z adjustments being made by the micrometer to translate the diodes so that the active area of the photodiode can be located in the X, Y, and Z optical axes within a specific tolerance range.

Other holding mechanisms can be used, such as a vacuum chuck. In either of these cases a quick release mechanism may be included so as to move the plunger out of the way during rotation of table 56.

Note that before the photodiodes in the carrier plate are put in place, initial calibration procedures can be carried out. For instance, a "bull's eye piece," which is a properly aligned and mounted photodiode, carrier plate assembly, is set up in one of the seven mounting holes in the rotating table to set dead center of the rotating table to the optical axis of the microscope.

Positioning

Figure 9:
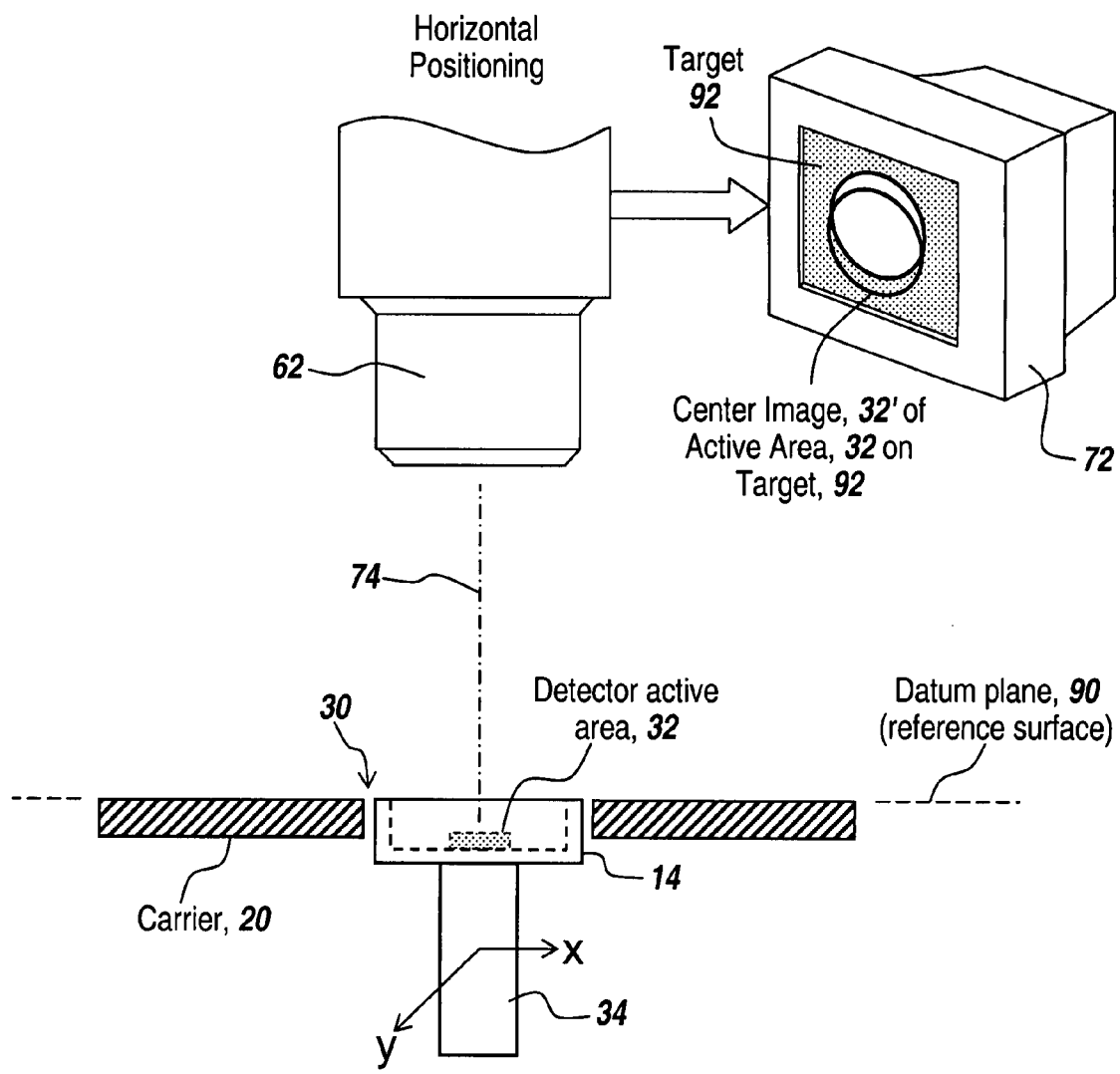
FIG. 9 is a diagrammatic illustration of the lateral positioning of the active element of the detector within the oversized aperture of the carrier utilizing a target having a circular profile matching the circular profile of the active element of the detector, with the can and the detector being moved in orthogonal directions through the movement of the magnetic plunger.

Referring to FIG. 9, what is now described is the horizontal positioning of the active area of the detector within oversized aperture 30 of carrier 20. The horizontal positioning may be accomplished before or after the vertical positioning but is described herein first for convenience.

Here it can be seen that can 14 is positioned atop plunger 34 so as to be able to move the detector active area 32 in the X and Y directions. For horizontal positioning, a target 90 is displayed on screen 72 and the active area 32 as imaged by the camera mounted on the microscope is projected as image 32' on display 72. By manipulation of plunger 34, the operator is able to center the image of the active area 32 on target 90, thus to establish relatively tight lateral tolerances, i.e., in the X and Y directions.

Figure 10:
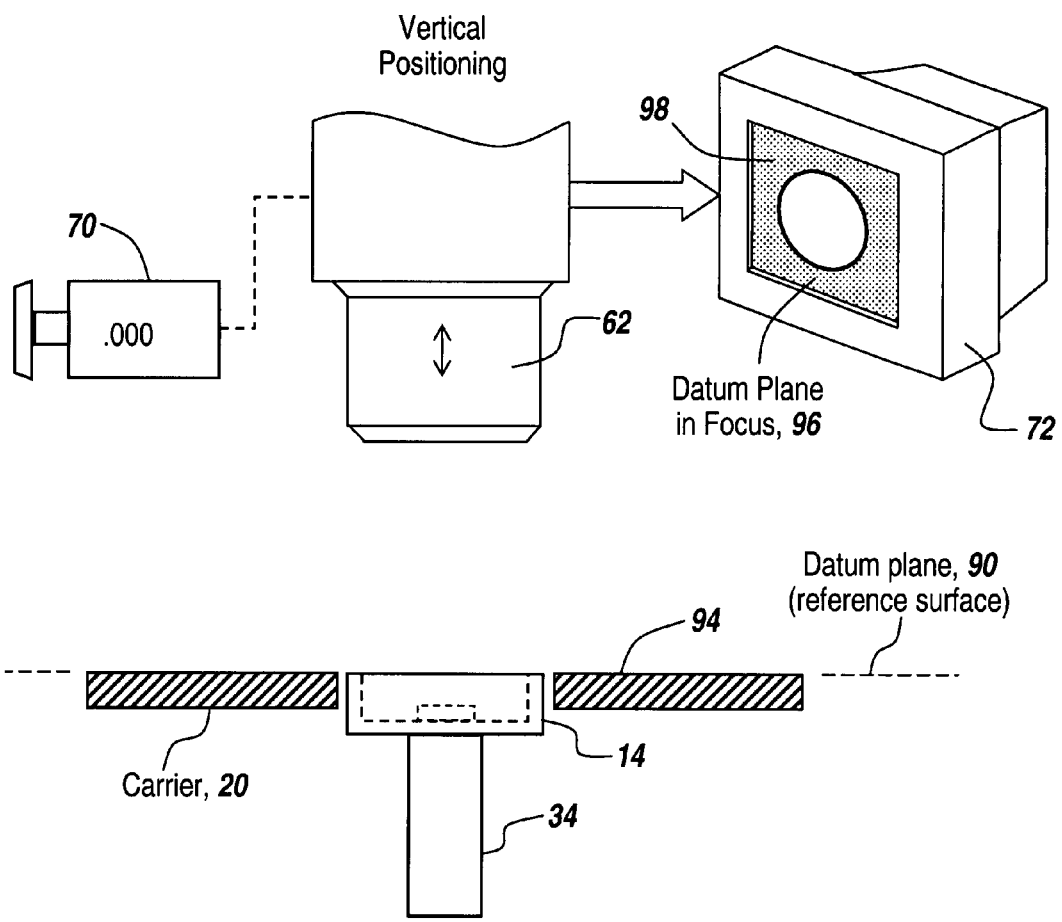
FIG. 10 is a diagrammatic illustration of the vertical positioning of the active area of the detector, illustrating the determination of the position of the datum plane through the focusing of the microscope to bring the datum plane into focus, with the digital depth gauge associated with the microscope being set to zero at this point.

This having been accomplished and referring now to FIG. 10, the more critical vertical location of the active detector area is now discussed. As seen in FIG. 10, there are two steps to the positioning of the active area of the detector in the vertical or Z axis.

The first step is to determine the position of the datum plane or reference surface 90 with respect to the position of microscope 62. In order to do so, the microscope images the top surface 94 of carrier 20, which serves to define datum plane 90 as a reference surface. During imaging, the image 96 of datum plane surface 94 comes into focus as illustrated at 98. When this is accomplished, the microscope is at a predetermined distance from the datum plane and the digital depth gauge 70 is set to zero.

By setting the digital depth gauge to zero, one establishes the datum plane 90 at a precise distance from the optics of microscope 62.

Figure 11:
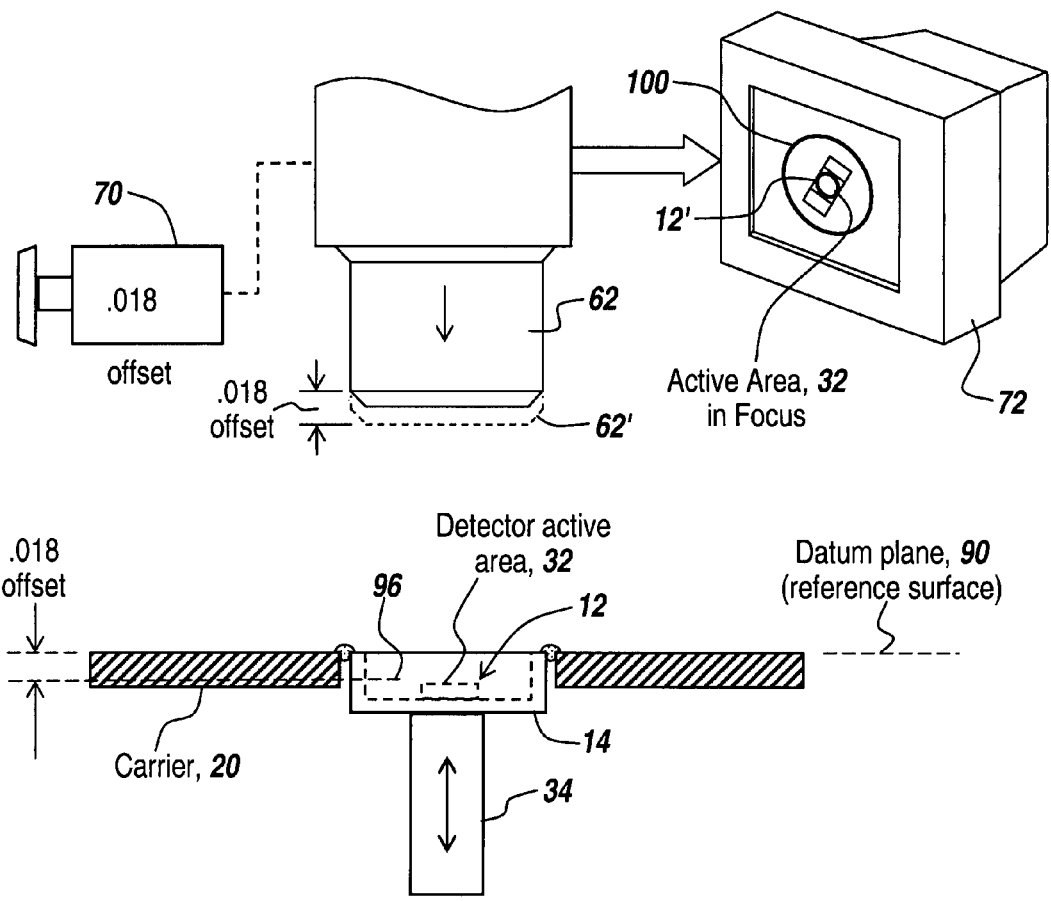
FIG. 11 illustrates the positioning of the detector active area relative to the datum plane established in FIG. 10 by lowering the microscope by a predetermined offset corresponding to the position below the datum plane that the detector active area is to be located at, and movement of the magnetic plunger up and down until such time as the image of the active area of the detector is in focus, thus to establish that the active detector area is offset by the predetermined offset required to keep the active area at the point of focus of an overlying relay lens.

Referring now to FIG. 11 and having established the position of datum plane 90 relative to the position of microscope 62, if it is desired to position the detector area 32 with an offset with respect to datum plane 90 of, for instance, 0.018 inch, which offset corresponds exactly to the focal point of an overlying relay lens indexed to the reference surface established by datum plane 90, then the microscope is lowered to the offset position illustrated by 62' as established by lowering the microscope until the digital gauge shows a 0.018 offset. As shown at 96, this establishes the predetermined position of where the active detector is to be.

As will be appreciated, the image 100 on display 72 will become out of focus by virtue of the lowering of the microscope. However, when the image of detector 12 is made to come into focus by maneuvering plunger 34, then the active detector area 32 will be at position 96 and thus be exactly at the focal point of an overlying relay lens.

By this focus/de-focus/re-focus technique, the precise position of active area 32 can be established at a predetermined offset below datum plane or reference surface 90, which predetermined offset is determined to put the detector active area exactly at the focus of the overlying lens.

Figure 12:
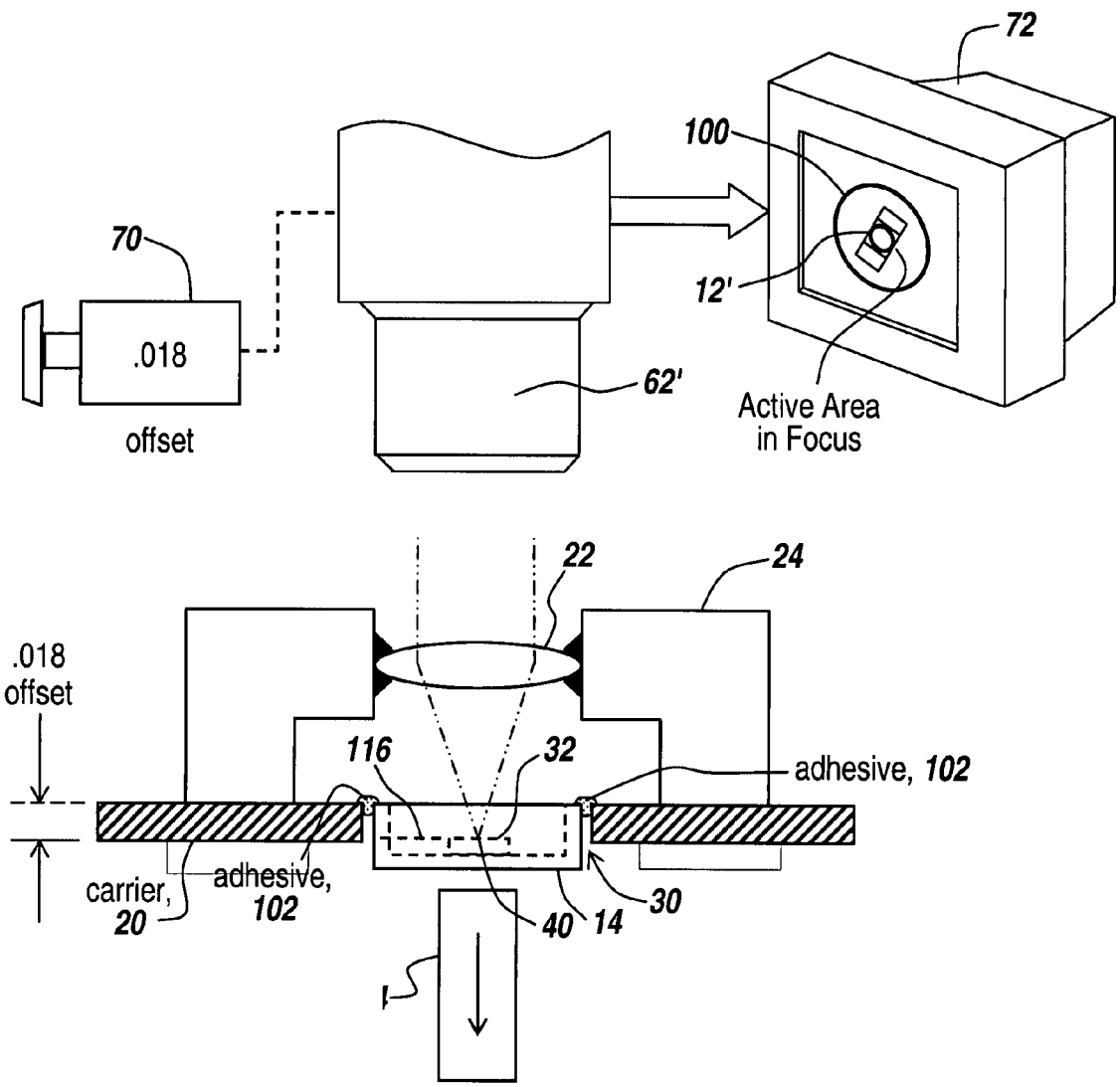
FIG. 12 is a diagrammatic illustration of bonding of the detector can of FIG. 11 to the aperture walls of FIG. 11 when the active detector area is properly positioned, both laterally and offset-wise, also showing the removal of the magnetic plunger after adhesive attachment and the mounting of the lens assembly to the top surface of the carrier, such that the focal point of the lens in the lens assembly is precisely at the top surface of the active area of the detector, with the detector being laterally aligned at the center line of the lens.

Referring now to FIG. 12, having established the lateral and vertical position of can 14 such as to establish the position of active area 32 at focus 40 of lens 22, adhesive dots 102 are applied between the periphery of oversized aperture 30 and the edge of can 14 to adhesively secure the can in place in oversized aperture 30. The adhesive in one embodiment is a dot of UV-cure adhesive such as Echobond UV-9000, which may be set by projecting ultraviolet light onto the adhesive.

Figure 13:
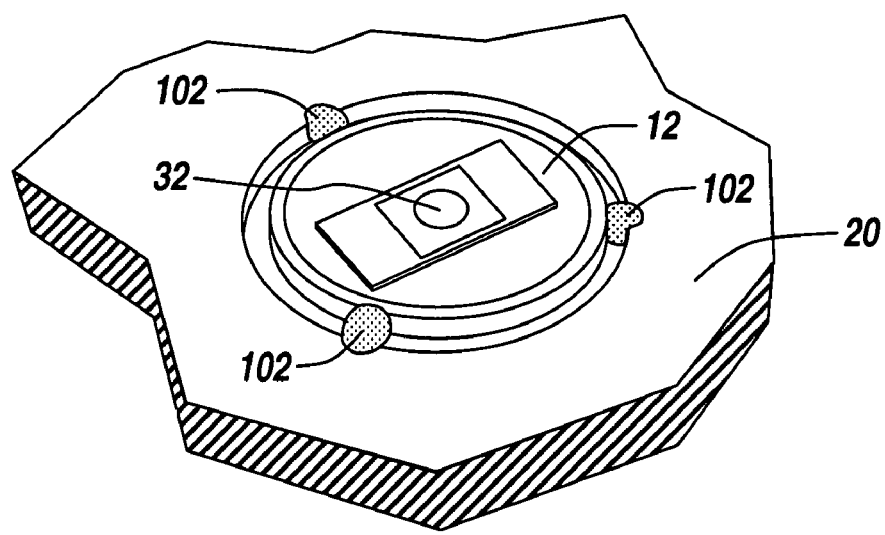
FIG. 13 is a diagrammatic illustration of adhesive bonding of the can of the detector that has previously been aligned to the oversized aperture of the carrier.

Referring now to FIG. 13, what is shown is the completed alignment of detector 12 and more particularly its active area 32 relative to carrier 20, which provides the reference surface 90 onto which the relay lenses are mounted. Thus, the active area 32 is aligned in the X, Y, and Z directions and establishes precisely within tight tolerances the position of active area 32 relative to the relay lenses.

Figure 14:
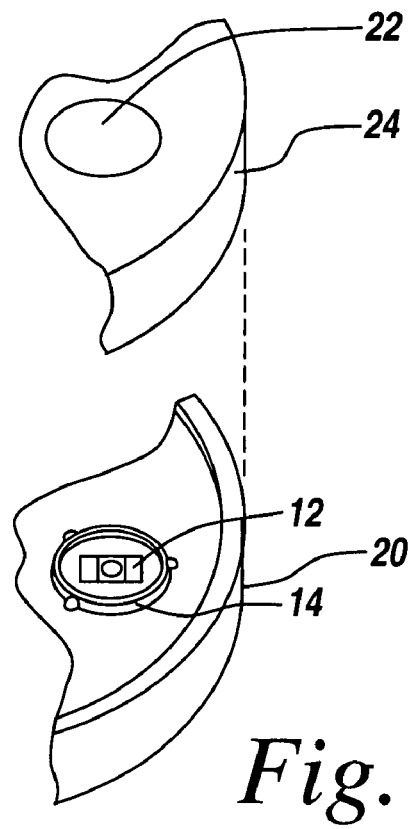
FIG. 14 is a diagrammatic illustration of the placement of the lens assembly in optical alignment with the underlying photodiode detectors to complete the combination lens assembly photodetector array assembly.

Referring to FIG. 14, completion of the detector/relay lens assembly is illustrated in FIG. 14 in which lens assembly 24 is positioned on top of carrier 20, with the lens 22 in alignment with detectors 12. Where the position of the lens assembly is keyed to referral surface 26 of carrier 20.

Figure 15:
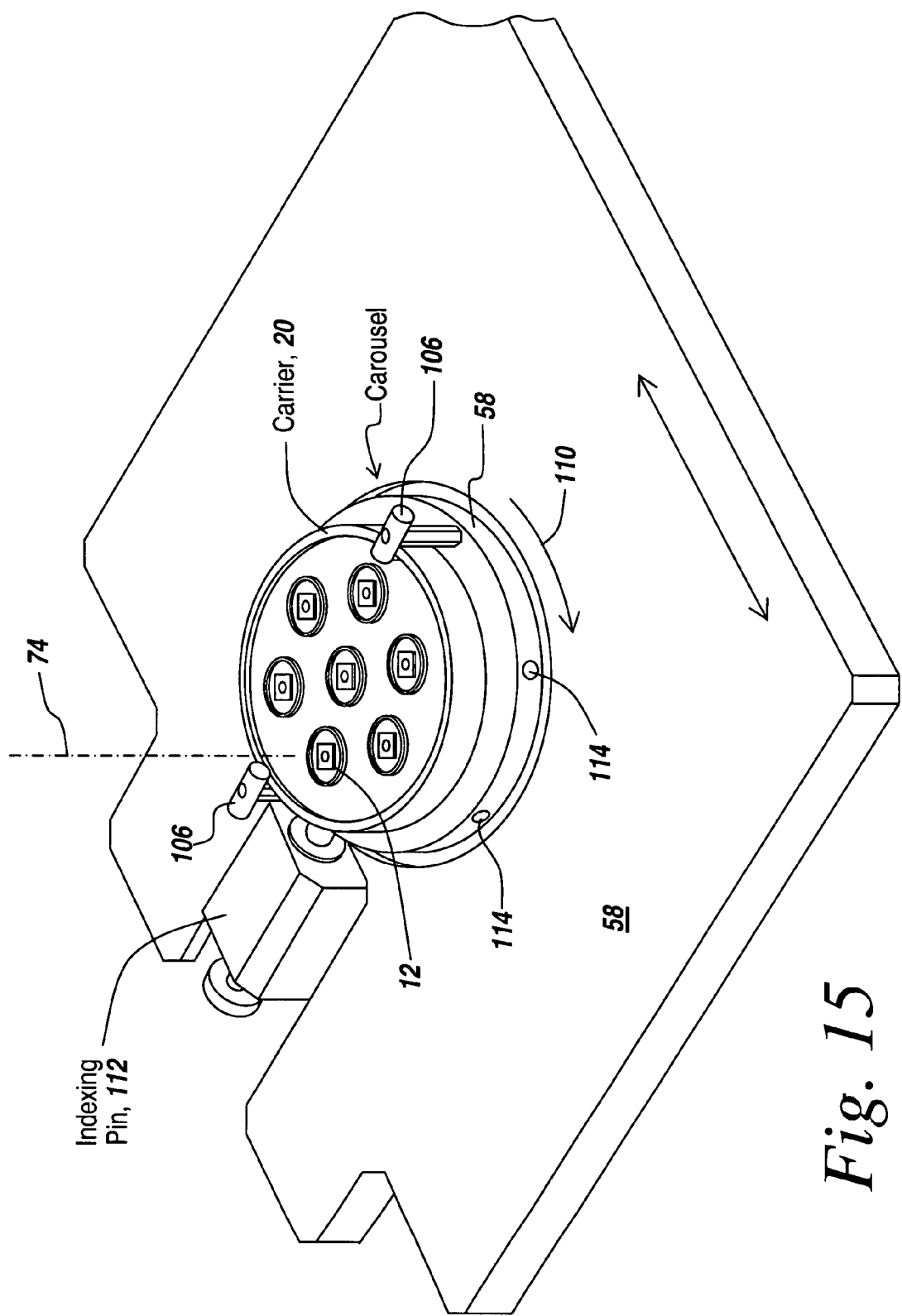
FIG. 15 is a diagrammatic illustration of the apertured carrier in which the carrier is clamped to a carousel for rotation about its axis, with an indexing pin utilized to position a photodetector along the optical axis of the overlying microscope; and, FIG. 16 is a diagrammatic illustration of the plate into which the carrier is disposed, which has a slot therein to accommodate movement of the entire carrier so as to be able to center the center photo detector on the optical axis of the microscope.

Referring to FIG. 15, carrier 20 is shown located on the rotatable table 58, being secured to rotatable table 58 by clamps 106. Rotatable table 58 is rotated as illustrated by arrow 110 so as to bring a particular detector 12 in alignment with the optical axis 74 of the microscope. Note that an indexing pin 112 is utilized that cooperates with plate apertures 114 in plate 58 to index the carousel comprising rotary plate 58, carrier and detectors in translatable table 58 is shown in one position 116 to align the outer detectors, and in another portion 118 to align the center detector. A slot 119 is used so that the plunger need not be fully withdrawn when going from one position to the other.

While the present invention has been described in connection with the preferred embodiments of the various figures, it is to be understood that other similar embodiments may be used or modifications or additions may be made to the described embodiment for performing the same function of the present invention without deviating therefrom. Therefore, the present invention should not be limited to any single embodiment, but rather construed in breadth and scope in accordance with the recitation of the appended claims.

What is claimed is:

1. A method for passively positioning the active area of a photodiode at the focus of a lens without having to physically probe the surface of the active area to determine its position, the photodiode being located in a housing having a reference surface, comprising the steps of:

mounting the photodiode housing in an oversized aperture in a carrier; and, manipulating the photodiode position in the oversized aperture until the photodiode active area is at a predetermined distance from the reference surface of the housing utilizing microscope focus, whereby the vertical position of the photodiode active area relative to the reference surface is accurately established.

2. The method of claim 1, wherein the manipulating step using microscope focus includes locating the position of the reference surface as being in focus when viewed by the microscope, offsetting the microscope from this in-focus position by a predetermined offset distance and moving the photodiode housing in a vertical direction until such time as the photodiode active area is in focus and at the predetermined offset distance.

3. The method of claim 2, and further including the step of locating a lens on the reference surface such that the focal point of the lens is positioned at the offset photodiode active area.

4. The method of claim 1, and further including the step of using the microscope and a video camera to image the photodiode active area onto a display, providing the display with a target corresponding to the active area of the photodiode and manipulating the housing within the oversized aperture until the outline of the photodiode active area as imaged on the display matches the target, thereby to laterally position the photodiode active area.

5. The method of claim 1, and further including the step of supporting the housing within the oversized aperture utilizing a member having means for releasably attaching the housing to the member and a micrometer linkage system for moving the member in three orthogonal directions, thus to move the housing in three orthogonal directions within the oversized aperture.

6. The method of claim 5, wherein the member includes a magnet for releasably securing the housing to the member.

7. The method of claim 5, wherein the member includes a vacuum chuck for releasably securing the housing to the member.

8. The method of claim 1, and further including adhesively attaching the housing to the carrier after positioning.

9. The method of claim 8, wherein the adhesive is an ultraviolet-settable adhesive.

10. The method of claim 1, wherein the carrier includes a number of oversized apertures arranged in a circle, the oversized apertures adapted to house a like number of housings and respective photodiodes, and further including the step of mounting the carrier on an indexed rotating table so as to align a predetermined oversized aperture on the optical axis of the microscope, whereby after positioning of the active area of a photodiode in a housing in one oversized aperture, the rotating table rotates another oversized aperture into alignment along the optical axis of the microscope.

11. The method of claim 10 and further including mounting the rotatable table on a translatable table, and further including providing the carrier with an additional oversized aperture, and further including the step of utilizing the translating table to center the additional oversized aperture along the optical axis of the microscope.

12. Apparatus for positioning of the active area of a photodiode within an oversized aperture in a carrier, the photodiode being situated in a housing, comprising:

a member for releasably securing the housing of said photodiode within said oversized aperture, said housing having a reference surface;

a micrometer linkage system coupled to said member for moving said member in orthogonal directions;

a microscope over said carrier having a field of view incorporating said oversized aperture and photodiode;

a video camera mounted on said microscope;

a display coupled to said video camera; and, a digital depth gauge to record the position of the microscope, whereby a focus/de-focus/re-focus technique can be utilized to position the active area of said photodiode relative to said reference surface to a high degree of accuracy, such that when a lens is mounted to said reference surface and when said active area of said photodiode is located at a predetermined distance from said reference surface, the active area of said photodiode is accurately positioned at the focus of said lens.

13. The apparatus of claim 12, wherein said carrier includes a number of oversized apertures adapted to house a like number of photodiodes in a like number of housings, said oversized apertures being arranged in a circle about the center point of said carrier, and further including a rotary table for supporting said carrier such that when said rotary table carrier is rotated to a predetermined position, a predetermined aperture will be positioned on the optical axis of said microscope.

14. The apparatus of claim 13, wherein said carrier includes a central oversized aperture adapted to carry an additional photodiode and associated housing, and further including a translatable table, said rotating table being mounted on said translating table, whereby said central oversized aperture may be moved in alignment along the optical axis of said microscope.

15. A method for assuring maximal light output from a photodiode, comprising the steps of:
   imaging light onto the photodiode with a lens, the photodiode having an active area; and,
   positioning the photodiode using a microscope focus/de-focus/re-focus technique such that the active area is at the focus of the lens, whereby the active area of the photodiode be precisely positioned at the focal point of the lens utilizing a passive technique.

16. The method of claim 15, wherein the microscope focus/de-focus/re-focus technique includes determining the vertical position of the active area of the photodiode utilizing the microscope, a video camera mounted on the microscope and a display coupled to the camera, the position of the active area of the photodiode being determined by an in-focus condition when the active area of the photodiode is moved to be in focus.

17. The method of claim 16, wherein the photodiode is located in a hermetically sealed can having a transparent top cover and a reference surface and wherein the can is moveably located within an oversized aperture of a carrier, and further including the step of manipulating the can within the oversized aperture until the location of the active area of the photodiode as determined by the microscope, video camera and display is at the focus of the lens.

18. The method of claim 17, and further including the step of providing a target on the display relating to a predetermined lateral position that the active area of the photodiode is to coincide with, and manipulating the can until the imaged active area of the photodiode corresponds to the target on the display.

19. The method of claim 17, wherein the step of manipulating the can includes the steps of:
   determining the position of the reference surface of the can when the reference surface is in focus;
   offsetting the microscope from the in-focus position by a predetermined distance corresponding to the distance the active area of the photodiode within the can is to achieve from the reference surface; and
   manipulating the can within the oversized aperture until the active area of the photodiode is in focus.

* * * * *